United States Patent
Bloom et al.

(10) Patent No.: US 9,060,437 B2
(45) Date of Patent: Jun. 16, 2015

(54) SYSTEM AND METHOD FOR OPERATING A STENCIL PRINTER

(75) Inventors: Jonathan Joel Bloom, North Falmouth, MA (US); Joseph A. Perault, Natick, MA (US); Michael E. Donelan, Upton, MA (US); James E. Fox, Uxbridge, MA (US); Gregory Lefebvre, Kensington, NH (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 739 days.

(21) Appl. No.: 13/363,586

(22) Filed: Feb. 1, 2012

(65) Prior Publication Data

US 2013/0192482 A1 Aug. 1, 2013

(51) Int. Cl.
| | | |
|---|---|---|
| G06F 3/12 | (2006.01) | |
| H05K 3/12 | (2006.01) | |
| B41F 15/08 | (2006.01) | |
| G06F 9/445 | (2006.01) | |
| G06F 9/54 | (2006.01) | |
| G06K 15/00 | (2006.01) | |

(52) U.S. Cl.
CPC ............. *H05K 3/1216* (2013.01); *B41F 15/08* (2013.01); *G06F 9/44526* (2013.01); *G06F 9/547* (2013.01); *H05K 3/1241* (2013.01)

(58) Field of Classification Search
CPC ...... B41F 15/08; G06F 9/44526; G06F 9/547
USPC ........ 358/1.1, 1.9, 1.13, 1.14, 1.15, 1.18, 3.2, 358/3.29, 3.31
See application file for complete search history.

(56) References Cited

U.S. PATENT DOCUMENTS

| | | | |
|---|---|---|---|
| 6,754,551 B1 | 6/2004 | Zohar et al. | |
| 7,117,504 B2 * | 10/2006 | Smith et al. | 719/328 |
| 7,324,861 B1 * | 1/2008 | Zheng | 700/97 |
| 2001/0046862 A1 * | 11/2001 | Coppinger et al. | 455/435 |
| 2003/0023336 A1 | 1/2003 | Kreidler et al. | |
| 2005/0071996 A1 | 4/2005 | Ray | |
| 2007/0046283 A1 | 3/2007 | Onishi et al. | |
| 2008/0152411 A1 | 6/2008 | Konig et al. | |
| 2011/0067024 A1 | 3/2011 | Chiu et al. | |

OTHER PUBLICATIONS

Notification of Transmittal of the International Search Report and the Written Opinion of the International Searching Authority from corresponding PCT/US2013/023759 mailed May 27, 2013.

* cited by examiner

*Primary Examiner* — Gabriel Garcia
(74) *Attorney, Agent, or Firm* — Lando & Anastasi, LLP

(57) ABSTRACT

A material applicator includes a printing device configured to deposit viscous material upon a circuit board, and a controller operatively coupled to the printing device. The controller is configured to control a plurality of system components, including an operating system component configured to operate the printing device, and a remote interface component configured to exchange printer operation data between the operating system component and at least one plug-in application. The plug-in application is configured to extend capabilities of the operating system component.

18 Claims, 3 Drawing Sheets

SYSTEM AND METHOD FOR OPERATING A STENCIL PRINTER

BACKGROUND

Various embodiments relate generally to industrial control systems and, more particularly, to systems and methods of extending capabilities of an operating system of a stencil printer or a dispensing machine.

One conventional technique for manufacturing circuit boards involves screen printing of solder paste or other adhesives onto the surface of a circuit board so that electronic components can thereafter be deposited onto the board. The screen printing may be performed by a stencil printer. Advancements in industrial automation technology have enabled the machine control capabilities of stencil printers to become increasingly automated. Many of these capabilities may be facilitated by a software-based operating system of the stencil printer, and may include motion control, input/output, database support, vision capabilities, diagnostics, and statistical process control (SPC) capabilities. Such capabilities may also include user interfaces that are designed to provide ease-of-use and commonality of operation, and which may be compatible with standard personal computer-based operating systems, such as Windows® by Microsoft Corp. in Redmond, Wash.

The standard capabilities of the stencil printer may, in some instances, be optionally extended through modifications to the operating system to satisfy particular operational requirements or customer requests. Such modifications are typically implemented and tested by the manufacturer of the machine to ensure proper operation of the stencil printer and assure quality control of the manufacturer's products (e.g., for warranty, servicing and support purposes). Because some modifications to the operating system may occur in response to customer-specific requests for improvements or additional features, implementing the modifications can be expensive and time-consuming for the manufacturer, particularly if the modifications only benefit one or very few customers. Further, such customers may incur delays or other inconveniences while waiting for the manufacturer to implement the requested changes.

SUMMARY

According to one embodiment, a material applicator includes a printing device configured to deposit viscous material upon a circuit board, and a controller operatively coupled to the printing device. The controller is configured to control a plurality of system components, including an operating system component configured to operate the printing device, and a remote interface component configured to exchange printer operation data between the operating system component and at least one plug-in application. The plug-in application is configured to extend capabilities of the operating system component. The material applicator includes one of a stencil printer configured to deposit viscous material upon a circuit board and a dispensing machine configured to deposit the viscous material upon the circuit board.

In one embodiment, the remote interface component may be further configured to exchange the printer operation data with the at least one plug-in application using remote procedure calls (RPC). In another embodiment, the remote interface component may include a plurality of predefined printer functions. In yet another embodiment, the plurality of predefined printer functions may include at least one of a printer start function, a printer stop function, a printer pause function, a printer configuration function and a printer status function.

In one embodiment, the material applicator may include a network interface operatively connected to the controller and configured to be connected to a communication network. In another embodiment, the at least one plug-in application may reside on at least one remote computer connected to the communication network. In yet another embodiment, the material applicator may include means for arbitrating the exchange of printer operation data between the operating system component and the at least one remote computer.

In one embodiment, the plurality of system components may further include a license component configured to process a license key associated with the at least one plug-in application.

In one embodiment, the controller may be further configured to execute the operating system component independently of the remote interface component.

According to one embodiment, a method of operating a material applicator includes establishing at least one virtual connection between the material applicator and at least one computer over a communication network. The communication network is operatively connected to the material applicator. The method further includes exchanging, through the at least one virtual connection and in real time, printer operation data between the material applicator and at least one plug-in application. The plug-in application is configured to execute on the at least one computer. The material applicator includes one of a stencil printer configured to deposit viscous material upon a circuit board and a dispensing machine configured to deposit the viscous material upon the circuit board.

In one embodiment, the method may include managing operation of at least one function of the material applicator using a portion of the printer operation data to be received from the at least one plug-in application. In another embodiment, the at least one function may include at least one of a printer start function, a printer stop function, a printer pause function, a printer configuration function and a printer status function. In yet another embodiment, the at least one plug-in application may include at least two plug-in applications.

In one embodiment, the method may include arbitrating the exchange of the printer operation data between the material applicator and each of the at least two plug-in applications. In another embodiment, arbitrating may include restricting the management of the operation of the at least one function of the material applicator to one of the at least two plug-in applications.

In one embodiment, the method may include limiting an amount of the printer operation data exchanged between the material applicator and the at least one plug-in application based on a frequency of requests for printer operation data by the at least one plug-in application. In another embodiment, exchanging the printer operation data may include executing at least one remote procedure call (RPC).

In one embodiment, the method may include processing a license key associated with the at least one plug-in application. In another embodiment, the method may include limiting the exchange of the printer operation data with a respective one of the at least one plug-in application based on the license key.

In one embodiment, the method may include adjusting at least one operational parameter of the material applicator based on a portion of the printer operation data to be received from the at least one plug-in application. In another embodiment, the method may include providing a set of predefined printer functions to the at least one plug-in application. The predefined printer functions may be configured to extend capabilities of the material applicator.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
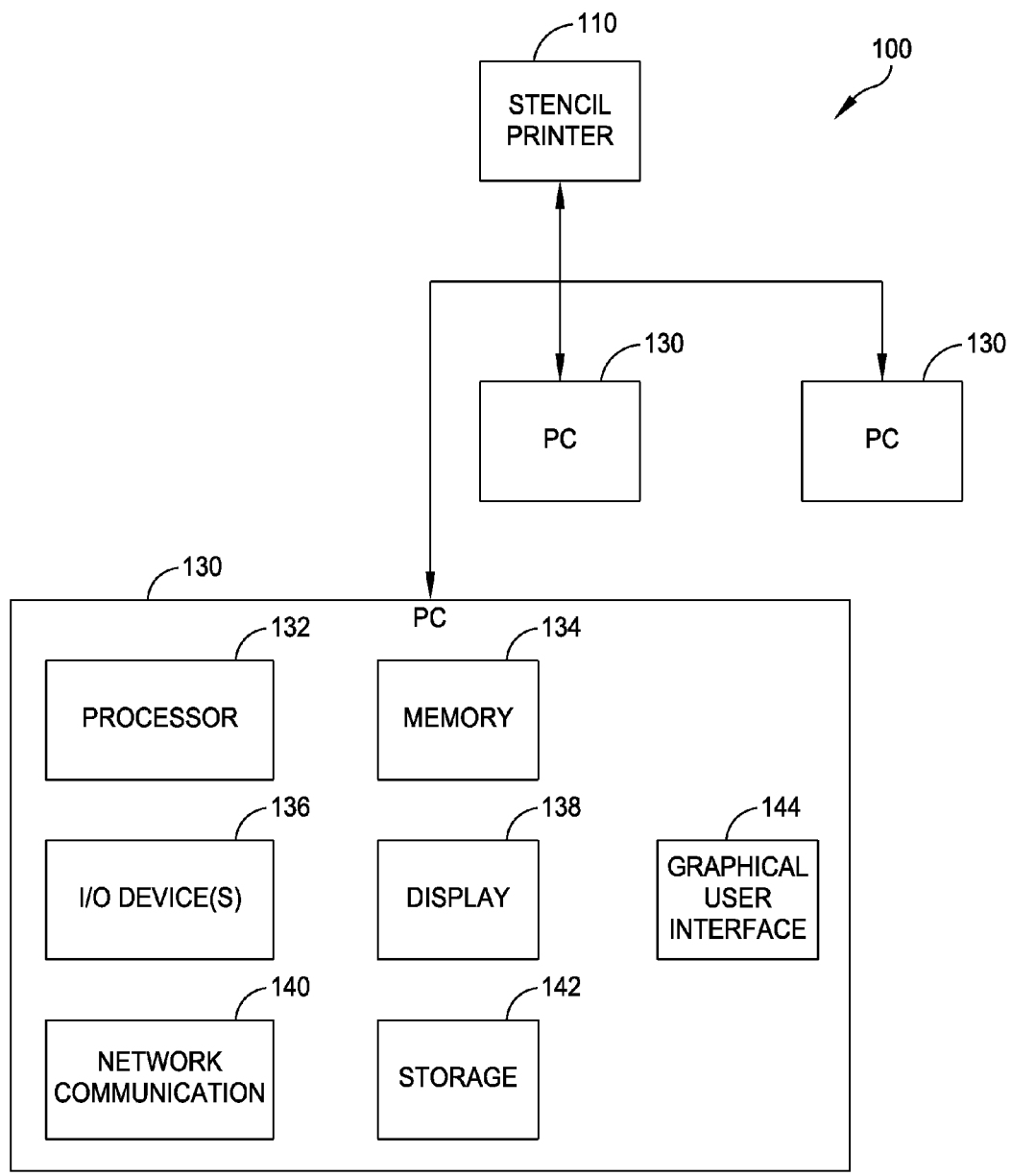
FIG. 1 is a block diagram of one example of a stencil printer system in accordance with one embodiment.

Embodiments are not limited in their application to the details of construction and the arrangement of components set forth in the following description or illustrated in the drawings. Some embodiments can be used with machines other than stencil printers, including pick-and-place machines or dispensing machines, and other embodiments are capable of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

It will be understood that embodiments can be implemented in a variety of material applicators, including stencil printers and dispensing machines, and that any references herein to embodiments including stencil printers apply equally to embodiments including dispensing machines.

As discussed above, certain machine capabilities are implemented directly by an operating system of the stencil printer. Some of these capabilities (e.g., certain control and monitoring functions) can be facilitated by the operating system through a user interface, such as a Windows-based graphical user interface (GUI). For some examples of machine capabilities that may be performed, at least in part, by the operating system, the reader is directed to U.S. Pat. No. 7,013,802 to Marszalkowski, which is incorporated by reference herein in its entirety.

The operating system is typically designed and built by the manufacturer of the machine. To ensure continuing proper operation of the printer, the manufacturer may restrict or prohibit others (e.g., users or customers) from directly modifying the operating system in certain ways, such as by changing or adding functions to the operating system software. However, sometimes customers may wish to access data and/or operational control of the printer that is not provided by the operating system and/or not available remotely (e.g., by an operator terminal or PC connected to the machine from a remote location). In response to customer requests for additional features, the manufacturer may decide to modify the operating system for the customer's benefit. If such modifications have broad applicability to many customers, it may benefit the manufacturer to make the changes and distribute the modified operating system to all customers. However, if the modifications have limited applicability and are likely to benefit only one or few customers, then the time and/or cost investments required by the manufacturer to implement the changes may be too great to justify from a business perspective. In such situations, the customer requests may be denied or deferred, possibly leading to some degree of customer dissatisfaction with the product and/or manufacturer.

According to one aspect, it is appreciated that in some cases it is desirable to allow the user to extend the capabilities of the operating system without modifying the operating system itself. For example, the user may wish to receive certain data regarding machine operations, including user-configurable alarms and machine status updates. Further, the user may wish to invoke remote control of the printer, such as stopping or pausing operations from an operator terminal (e.g., a PC) that is not local to the machine or factory control station (e.g., the user is in a different facility than the machine) or from multiple different locations (e.g., different locations within a manufacturing plant). By designing the operating system to facilitate customer-implemented extensions, the integrity of the operating system can be preserved, while still allowing users to customize the set of features associated with the operations of the machine to suit their individual needs and without much, if any, manufacturer intervention.

FIG. 1 is a block diagram of one example of an extensible stencil printing system 100, according to one embodiment. A stencil printer 110, or other material applicator, such as a dispensing machine, is operatively connected to a communication network 120 (e.g., an intranet or the Internet). The communication network 120 may include wired and/or wireless components. In some embodiments, types of industrial machines other than stencil printers may be employed. One or more operator terminals, including personal computers (PCs) 130, may also be operatively connected to the communication network 120.

In certain embodiments, the material applicator can include a stencil printer, such as an Accela® or Momentum® Series stencil printer platform offered by Speedline Technologies, Inc., the assignee of the present disclosure. In some embodiments, the material applicator can include a dispensing machine, such as a Camalot FX-D®, XyflexPro®+ or XyflexPro® DLM dispensing system, also offered by Speedline Technologies.

Various embodiments may be implemented on one or more type of computer systems. These computer systems may be, for example, general-purpose computers such as those based on Intel® PENTIUM®-type processor, Motorola PowerPC®, AMD Athlon™ or Turion™, Sun™ UltraSPARC®, Hewlett-Packard PA-RISC® processors, or any other type of processor. It should be appreciated that one or more of any type computer system may be used. Further, portions of the system 100 may be located on a single computer or may be distributed among a plurality of computers operatively connected together by the communications network 120.

A general-purpose computer system according to one embodiment is configured to perform any of the described functions, including but not limited to, extending the capabilities of the operating system of a stencil printer or other industrial automation system. It should be appreciated that the system may perform other functions, including, but not limited to, receiving board and machine status information from the stencil printer, such as SPC data, uptime, downtime, errors, input/output state changes, number of boards printed, wipes that occur, squeegee strokes, barcodes, etc., instructing the stencil printer to perform functions including pause with error, stop production, send barcode information, print or pass-through, etc. It should also be appreciated that the embodiments described herein are not intended to limit the scope of the disclosure to any particular function or set of functions, as some of the embodiments are designed to enable extensibility of the stencil printer 110 in a flexible manner, including implementation of new features and functions.

Various aspects of the system 100 may be implemented as specialized software executing in the stencil printer and/or one or more of the PCs 130. Each PC 130 may include a processor 132 connected to one or more memory devices 134, such as a disk drive, integrated circuit memory, or other device or medium configured for storage and retrieval of data. The memory 134 is typically used for storing programs and data during operation of the PC 130. Components of the PC 130 may be coupled by an interconnection mechanism (not shown), which may include one or more busses (e.g., between components that are integrated within a same machine) and/or a network (e.g., between components that reside on separate discrete machines). The interconnection mechanism enables communications (e.g., data, instructions) to be exchanged between various system components of the PC 130 (e.g., processor 132, memory 134, etc.).

Each PC 130 also includes one or more input/output (I/O) devices 136, for example, a keyboard, mouse, trackball, microphone, touch screen, a printing device, display screen 138, speaker, etc. In addition, the PC 130 may contain one or more interfaces (e.g., network communication device 140, serial port and/or universal serial bus (USB)) that connect the PC 130 to a communication network (in addition or as an alternative to the communication network 120).

Each PC 130 may further include a storage system 142, which may utilize a computer readable and writeable nonvolatile recording medium in which signals are stored that define a program to be executed by the processor or information stored on or in the medium to be processed by the program. The medium may, for example, be a disk or flash memory. Typically, in operation, the processor 132 causes data to be read from the nonvolatile recording medium into another memory that allows for faster access to the information by the processor than does the medium. This memory is typically a volatile, random access memory, such as a dynamic random access memory (DRAM) or static memory (SRAM). The memory may be located in the storage system 142, or in the memory 134. The processor 132 generally manipulates the data within the memory 134, and then copies the data to the medium associated with the storage 142 after processing is completed. A variety of mechanisms are known for managing data movement between the medium and integrated circuit memory element and the invention is not limited thereto. Embodiments are not limited to a particular memory system or storage system.

The system 100 may include specially-programmed, special-purpose hardware, for example, an application-specific integrated circuit (ASIC). Aspects may be implemented in software, hardware or firmware, or any combination thereof. Further, such methods, acts, systems, system elements and components thereof may be implemented as part of the computer system described above or as an independent component.

Although the system 100 is shown by way of example as one type of computer system upon which various aspects may be practiced, it should be appreciated that embodiments are not limited to being implemented on the system 100 as shown in FIG. 1. Various aspects may be practiced on one or more computers having different architectures or components than that shown in FIG. 1.

In one embodiment, the PC 130 and/or the stencil printer 110 may include a general-purpose computer system that is programmable using a high-level computer programming language. The PC 130 and/or the stencil printer 110 may instead be implemented using specially programmed, special purpose hardware. In the PC 130, the processor 132 is typically a commercially-available processor such as the well-known PENTIUM® class processor available from the Intel Corporation of Santa Clara, Calif., although many other processors are available. Such a processor usually executes an operating system which may be, for example, the Windows-based operating systems available from the Microsoft Corporation, the Mac OS® operating system available from Apple Inc. of Cupertino, Calif., one or more of the Linux-based operating system distributions (e.g., the Red Hat® Enterprise Linux® operating system available from Red Hat, Inc. of Raleigh, N.C.), the Solaris® operating system available from the Oracle Corporation of Redwood City, Calif., or UNIX operating systems available from various sources. It should be understood that embodiments are not limited to any particular operating system or hardware device. For example, in some embodiments, the PC 130 may include a mobile device, such as an iPhone® by Apple operating the iOS® operating system.

The processor and operating system together define a computer platform for which application programs in high-level programming languages are written. It should be understood that embodiments are not limited to a particular computer system platform, processor, operating system, or network. Also, it should be apparent to those skilled in the art that embodiments are not limited to a specific programming language or computer system and that other appropriate programming languages and computer systems could also be used.

One or more portions of the computer system may be distributed across one or more computer systems coupled to, for example, the communications network 120. These computer systems also may be general-purpose computer systems. These systems may permit the user to monitor and control various functions and data associated with the stencil printer 100. For example, various aspects may be distributed among one or more computer systems (e.g., servers) connected to the communication network 120 (or other network) and configured to provide a service to one or more client computers, or to perform an overall task as part of a distributed system. By way of further example, various aspects may be performed on a client-server or multi-tier system that includes components distributed among one or more server systems that perform various functions according to various embodiments. These components may be executable, intermediate (e.g., IL) or interpreted (e.g., Java® by Oracle Corporation) code which communicate over a communication network (e.g., the Internet) using a communication protocol (e.g., TCP/IP). It should be appreciated that embodiments are not limited to executing on any particular distributed architecture, network, or communication protocol.

Various embodiments may be programmed using an object-oriented programming language, such as SmallTalk, Java®, C++, Ada, or C# (C-Sharp). Other object-oriented programming languages may also be used. Alternatively, functional, scripting, and/or logical programming languages may be used. Various aspects may be implemented in a non-programmed environment (e.g., documents created in HTML, XML or other format that, when viewed in a window of a browser program, render aspects of a graphical-user interface (GUI) or perform other functions). Various aspects may be implemented as programmed or non-programmed elements, or any combination thereof.

In one embodiment, each PC 130 is configured to provide a graphical user interface (GUI) 144, which provides several features useful for production operators of stencil printers.

These features may include configuration tools for setting up, teaching, calibrating and troubleshooting the printer through a series of screens and options adapted for particular users and printers. Another feature may include communication of data between the printer and the operator, such as data for controlling and monitoring the operation of the printer. The GUI 144 can be configured to run on a computer that is either directly connected to the printer or remotely connected through a communication network.

Figure 2:
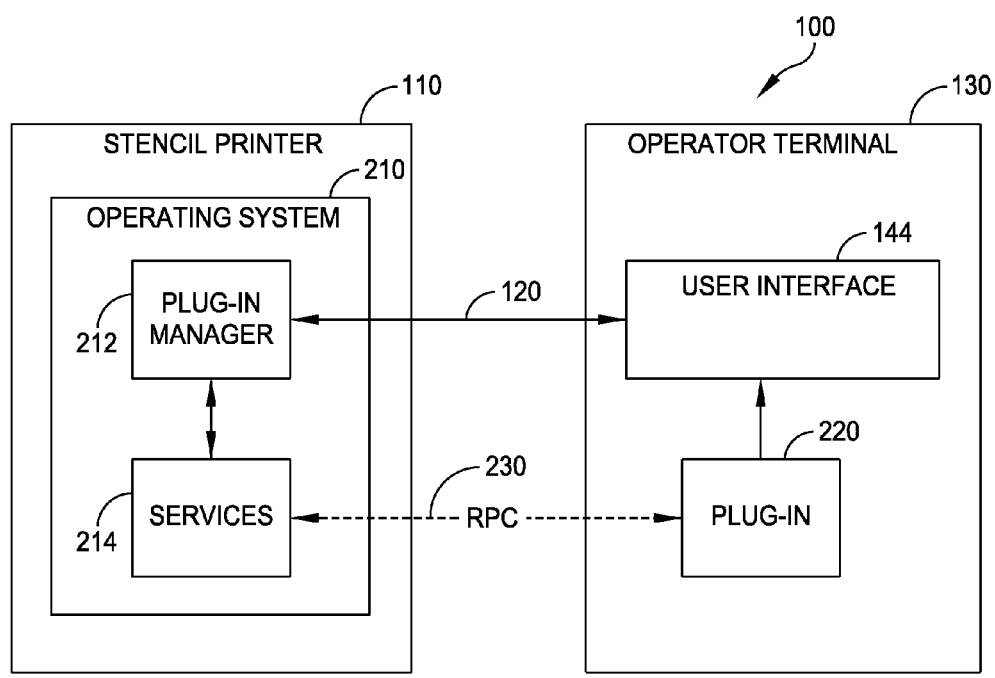
FIG. 2 is a block diagram of one portion of the system of FIG. 1 in accordance with one embodiment.

FIG. 2 is another block diagram of one portion of the system 100 of FIG. 1, according to one embodiment. The stencil printer 110 includes an operating system 210, which may be executed by a processor (not shown) integrated into the stencil printer or a control system associated with the stencil printer. The operating system 210 provides a plug-in manager 212 and one or more services 214. The services 214 may include services associated with the stencil printer 110, including controlling and monitoring various operations and capabilities of the stencil printer 110. The plug-in manager 212 may, in some embodiments, be a logically distinct component of the operating system 210 that can be configured to perform tasks associated with managing one or more plug-in modules 220 operating on the operator terminal 130 (e.g., a PC), as will be described below. The operator terminal 130 and associated elements, as well as the communication network 120, are not necessarily part of this embodiment, but are described for purposes of explaining one embodiment in which various functions and features of the operating system 210 and/or the plug-in manager 212 can be implemented.

As used herein, the term "plug-in" refers to a discrete software component that adds capabilities to, or modifies existing capabilities of, another software application by interfacing either directly with the other software application or indirectly through, for example, a user interface. For example, a plug-in may be used to enable third-party software developers to create software that extends the functionality of an existing application (e.g., add new features and/or modify existing features) without modifying the existing application, provided that the existing application supports such plug-ins. Examples of such software applications include the operating system 210 or the plug-in manager 212 component.

In one embodiment, as described above, the operating system 210 includes a plug-in manager component 212. The plug-in manager 212 provides specific services that enable a separately developed plug-in (e.g., plug-in 220), which is not necessarily included in this embodiment, interact with the plug-in manager 212. Portions of the operating system 210 (e.g., portions for controlling and monitoring the operations of the stencil printer 110) may function independently of the plug-in manager 212 and any plug-ins 220. Stated in another way, the operating system 212 does not depend on the plug-in manager 212 or the plug-ins to operate the stencil printer 110, although the plug-in manager 212 can enable a plug-in 220 to supplement or modify various functions of the operating system 212. Furthermore, the plug-in manager 212 acts as an interface (functional and/or data) through which the plug-in operates 220. In one example, the plug-in manager 212 may enable the plug-in 220 to exchange data with the operating system 210 and command the operating system 210 to perform an action (e.g., an action by the stencil printer, such as stop or pause printing) or other function provided by the services 214 of the operating system 210. For safety, the plug-in 220 may, for example, be prohibited by the operating system 210 from causing a stopped or paused printer to begin running, although such safety functionality can be configured as necessary and appropriate for ensuring equipment and personnel safety in a particular application.

In another embodiment, the operating system 210 and/or the plug-in manager 212 can limit or restrict the ability of the plug-in 220 to access certain services 214. For example, the plug-in 220 may be licensed for a particular printer 110 by the manufacturer or operator of the printer 110 using an option or feature licensing scheme. Each plug-in 220 may be given a unique license key and option identifier. The license key may be installed on the printer 110, for example, within the operating system 210. When the plug-in 220 connects to the operating system 210, it may present the option identifier to the operating system 210 (e.g., over the communication network 120). If the option is licensed for the printer 110, the plug-in manager 212 will allow the plug-in 220 to establish a communication connection with the operating system 210 (e.g., over the communication network 120). Licenses may be available in single instance or multiple instance forms. In the single instance case, the plug-in manager 212 will only allow one plug-in 220 to connect to the operating system 210 for that license at one time. If a second plug-in (not shown, but similar to plug-in 220) attempts to connect to the operating system 210 (e.g., over the communication network 120) using an option identifier which is already in use by another plug-in, and the option is only licensed for single instance use, the connection may be denied by the operating system 210. If a plug-in option identifier is licensed for multiple instances, there may be no or fewer restrictions on the number of different plug-ins that may connect to the operating system 210 using that option identifier.

In yet another embodiment, the operating system 210 and/or the plug-in manager 212 can provide data and operational security by limiting or restricting the ability of the plug-in 220 access certain data and commands in the stencil printer 110. For instance, the plug-in 220 may be authorized to access status information but not authorized to access control commands. The types and amounts of data so restricted can be customized for a particular application and on a per-plug-in (e.g., per user) or per machine basis.

In one embodiment, multiple users can be connected simultaneously to the same stencil printer 110 using different operator terminals 130 or different plug-ins 220 on one or more operator terminals 130. However, certain printer control functions, if available to multiple users, may be restricted so as to prevent the printer 110 from receiving conflicting commands (e.g., commands that the printer 110 is unable to execute). For example, if the printer 110 receives, substantially simultaneously, a first command from a first user and a second command from a second user, the first command may be processed prior to the second command, and the second command may be queued for later processing or ignored. Processing of the second command may be delayed until processing of the first command has been completed, unless the first user voluntarily agrees to give up control of the printer prior to completion of the first command. In some instances, control may be revoked from the first user involuntarily, for example, if the printer needs to stop or receives a higher priority command from another user. In another example, a local machine operator may manually revoke control from the first user and give control to the second user. In another embodiment, certain commands (e.g., data requests) can be processed simultaneously, and therefore queuing or delaying such commands may not be necessary.

In another embodiment, the operating system 210 provides an interface for each plug-in 220, and each plug-in 220 provides an interface for the operating system 210, which allows the operating system and the plug-in(s) to communicate bi-directionally without polling. Additionally, the plug-in 220 may provide portions of the user interface 144 that are not provided by the operating system 210, or the plug-in 220 may supplement portions of the user interface 144 that are provided by the operating system 210 (e.g., by displaying data in customized formats).

According to one embodiment, when a plug-in 220, which is running on an operator terminal 130, initially attempts to connect to the operating system 210 over the communication network 120, the operating system 210 verifies that the plug-in 220 is compatible (e.g., by checking a version number of the plug-in) and allows the connection if the plug-in 220 is compatible; otherwise, the operating system 210 denies the connection attempt. The operating system 210 may be configured to provide backward compatibility with older plug-in versions.

In one embodiment, a Remote Procedure Call (RPC) 230 is used as the underlying communications mechanism between the plug-in 220 and the services 214 via the user interface 144, the communication network 120, and the plug-in manager 212. RPC message acknowledgements may be provided by the plug-in manager 212 and/or the plug-in 220, depending on which direction a particular message is traveling. As described below, a plurality of interface methods may be grouped logically and subdivided into methods that a plug-in 220 can call into the operating system 210 (called "server methods") and methods that the operating system 210 can call into a plug-in 220 (called "client methods"). Each group of interface methods may, in some embodiments, correspond to separate RPC interfaces. The plug-in 220 may choose to implement any or all subsets of the server and client methods. Some examples of methods that may be supported by the operating system 210 are listed below.

The plug-in 220 can call any of the methods that are supported by the operating system 210 and that are permitted, for example, by a licensing or security scheme as described above, if such a schemes are utilized. The operating system 210 may have limited or no control over the behavior of the plug-in 220, in part because the plug-in 220 operates as an independent component. In some instances, the plug-in 220 may attempt to call multiple methods over a very short span of time (e.g., less than about one minute), or multiple plug-ins may attempt to make method calls over the same short span of time. The processing demands on the operating system 210 resulting from multiple method calls over a short span of time can lead to overloading the processing capacity of the system, which may have detrimental effects on printer operations. Any plug-in 220 behaviors that adversely affect the operating system 210 or stencil printer 110 may be considered abusive. Therefore, in one embodiment, the operating system 210 can invoke one or more contingency responses designed to limit the processing load imposed by servicing multiple or abusive requests. For example, the operating system 210 may limit the number of method calls from single and/or multiple plug-ins 220 that are serviced over the same period of time, or the operating system 210 can limit the number of active plug-ins 220 that are connected to the operating system 210 at the same time. In another embodiment, the operating system 210 can throttle back abusive plug-ins 220 (e.g., plug-ins that submit excessive requests to the operating system over a period of time) by limiting the number of requests the plug-in 220 can submit over a given period of time. For example, if a plug-in submits a high number of requests for data or control over a relatively short period of time, the operating system 210 may begin to deny some or all of the requests, or defer the requests until a later point in time, so as not to overload the processing capacity of the operating system due to the high number of requests.

In one embodiment, each plug-in interface is associated with a schema. Some methods may be associated with the schema, and may be supported by different schemas, while other methods, which are associated with different schemas, may not be supported by the schema. For example, all methods supported by one schema may also be supported by one or more later versions of the schema (i.e., the later schema is backwardly compatible with methods supported by earlier schemas), wherein some methods supported by the later version of the schema may not necessarily be supported by the earlier version of the schema. Among other functions, the methods associated with the schema can be used to view or modify various parameters associated with the operation of the stencil printer, including, for example, squeegee pressure, stroke speed, offsets (stencil alignments), and other data that can be viewed and modified in real time (e.g., while the printer is operating).

In one embodiment, the operating system 210 is configured to manage traffic between the printer 110 and the operator terminal 130. For example, the amount or rate of data exchanged between the operating system 210 and the operator terminal 130 may be restricted by the operating system 210 to minimize the amount of traffic on the communication network 120, to preserve data bandwidth that may be needed for performing core, critical or high priority functions, and to ensure adequate processing time is available for such functions. In another example, the plug-in 220 may subscribe to subsets of data (as opposed to subscribing to, e.g., all available data) to help minimize traffic on the communication network 120.

According to some embodiments, the following non-limiting list of exemplary methods may be provided by the operating system 210 for use by the plug-in 220. It will be understood that any plug-in 220 that is compliant with the schema may use or support any or all of the methods provided by the operating system, subject to any licensing and/or security restrictions imposed by the operating system 210 upon the plug-in 220.

Figure 3:
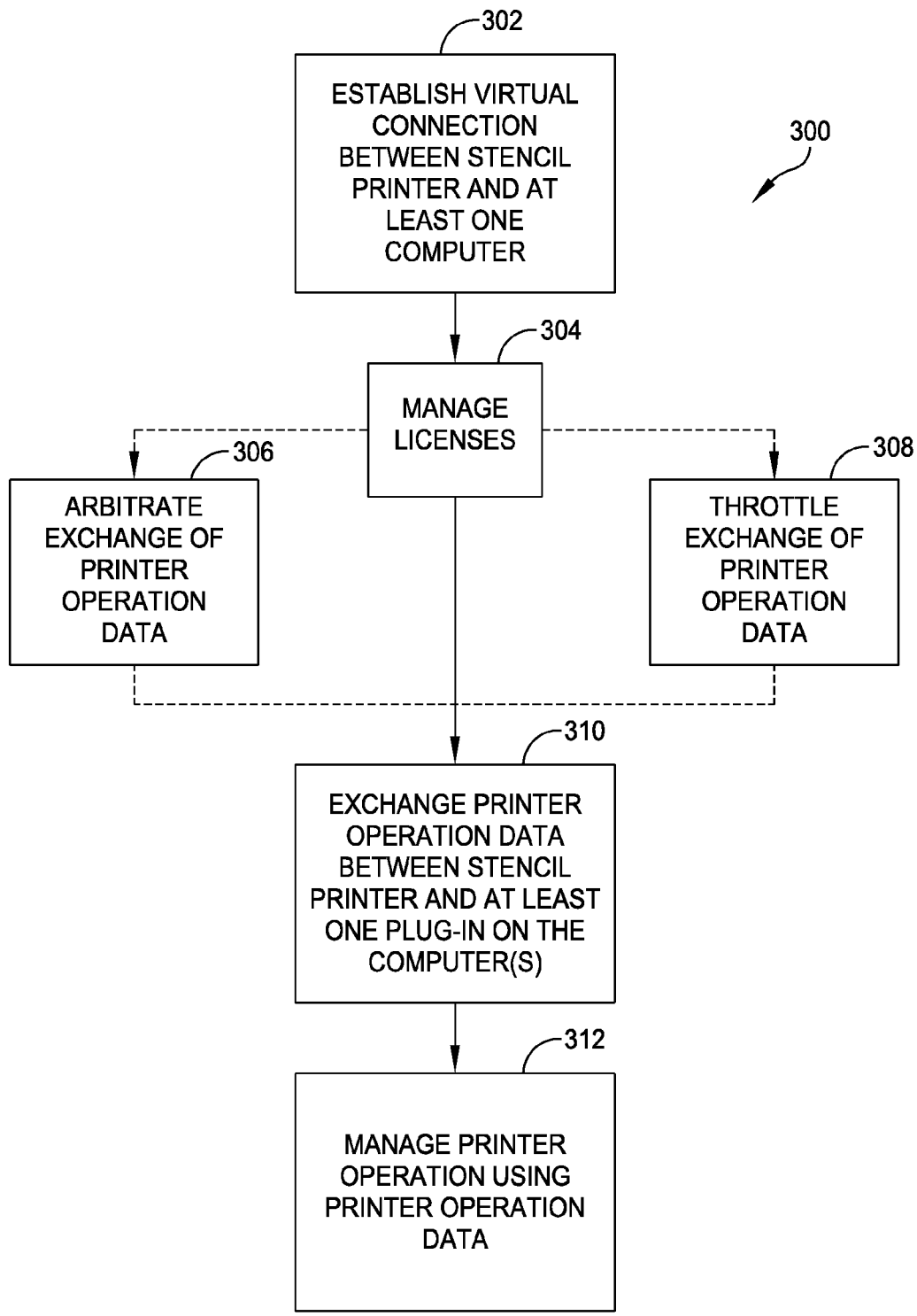
FIG. 3 is a flow diagram of one example of a method of operating a stencil printer in accordance with one embodiment.

Connection management
Alarm event notification
Printer alignment event notification
Circuit board event notification (e.g., failed inspection, processing complete, processing in progress, board rejected by operator, reset data, panel data)
Configuration event notification (e.g., user changed conveyor direction, user switched blades to pump or pump to blades, log file)
Conveyor event notification (e.g., board has arrived/left conveyor segment, change of conveyor state)
Environment event notification
Inspection event notification
Login event notification
Process program event notification
Machine state event notification (e.g., dispense completed, dispense begun, knead operation being performed, machine state changed, manual cleaning of stencil, beginning/end of print stroke, stencil inserted/removed by user, wipe started/completed)
Traceability event notification (e.g., barcode data)
Alarm configuration and management
Alignment configuration
Board management
Conveyor management
Environmental management
Inspection management
Login management
Process program management Machine state Traceability management FIG. 3 is a flow diagram of one example of a method of operating a stencil printer 300, according to one embodiment. At block 302, at least one virtual connection between a stencil printer and at least one computer is established. The virtual connection can be established over a communication network connected to the stencil printer and the computer. The virtual connection may, for example, include an open communication channel or other type of virtual connection, as will be understood by one of skill in the art. At block 304, license management tasks may optionally be performed. For example, if a licensing scheme is implemented, such as described above, the stencil printer may check the license or licenses held by the computer to determine whether to maintain the virtual connection and/or determine the access privileges held by the computer. If no valid license is held by the computer, the virtual connection may be terminated. If the license includes certain restrictions (e.g., single user, multiple user, etc.), then the restrictions can be invoked by the stencil printer accordingly.

Optionally, at block 306, any exchange of printer operation data (or other data exchanged using the virtual connection) may be arbitrated by the stencil printer, such as described above. For example, if multiple computers are commanding the stencil printer or requesting data at substantially the same time, the stencil printer may prioritize the requests by deferring or ignoring one or more of the commands or requests for data. Similarly, at block 308, the stencil printer may optionally throttle back computers that are attempting to overload the stencil printer with commands or requests for data by limiting the amount of data exchanged between the stencil printer and the computer, such as described above.

At block 310, data is exchanged between the stencil printer and the computer using the virtual connection. The exchange of data may, for example, be bi-directional; that is, from the stencil printer to the computer and from the computer to the stencil printer. In another example, the exchange of data may be unidirectional, such as where the computer is passively receiving data (e.g., receiving status data in a listen-only mode) sent by the stencil printer through the virtual connection, but where the computer generally sends no data or commands to the stencil printer.

At block 312, one or more operations of the stencil printer are managed using the printer operation data. Broadly, the operations can include any functions of the stencil printer that the stencil printer has enabled the computer to manage, including printer start, stop, pause, configuration and status, as well as any functions corresponding to the methods described above. As discussed above, for safety reasons the stencil printer may restrict or prohibit the computer from initiating some functions (e.g., a printer start function as well as certain other safety- or security-related functions), but, in general, the stencil printer can be configured to permit the computer to initiate any function suitable for a particular machine or application.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:

1. A material applicator, comprising:
    a printing device configured to deposit viscous material upon a circuit board; and
    a controller operatively coupled to the printing device and configured to control a plurality of system components including:
        an operating system component configured to operate the printing device; and
        a remote interface component configured to exchange printer operation data between the operating system component and at least one plug-in application configured to extend capabilities of the operating system component, wherein the material applicator includes one of a stencil printer configured to deposit viscous material upon a circuit board and a dispensing machine configured to deposit the viscous material upon the circuit board,
        wherein the controller is configured to manage operation of at least one function of the material applicator using a portion of the printer operation data to be received from the at least one plug-in application, and
        wherein the controller is further configured to arbitrate the exchange of the printer operation data between the operating system component and the at least one plug-in application.

2. The material applicator of claim 1, wherein the remote interface component is further configured to exchange the printer operation data with the at least one plug-in application using remote procedure calls (RPC).

3. The material applicator of claim 2, wherein the remote interface component includes a plurality of predefined printer functions.

4. The material applicator of claim 3, wherein the plurality of predefined printer functions includes at least one of a printer start function, a printer stop function, a printer pause function, a printer configuration function and a printer status function.

5. The material applicator of claim 1, further comprising a network interface operatively connected to the controller and configured to be connected to a communication network.

6. The material applicator of claim 5, wherein the at least one plug-in application resides on at least one remote computer connected to the communication network.

7. The material applicator of claim 1, wherein the plurality of system components further includes a license component configured to process a license key associated with the at least one plug-in application.

8. The material applicator of claim 1, wherein the controller is further configured to execute the operating system component independently of the remote interface component.

9. A method of operating a material applicator, the method comprising:
    establishing at least one virtual connection between the material applicator and at least one computer over a communication network operatively connected to the material applicator;
    exchanging, through the at least one virtual connection and in real time, printer operation data between the material applicator and at least one plug-in application configured to execute on the at least one computer,
    wherein the material applicator includes one of a stencil printer configured to deposit viscous material upon a circuit board and a dispensing machine configured to deposit the viscous material upon the circuit board;

managing operation of at least one function of the material applicator using a portion of the printer operation data to be received from the at least one plug-in application; and arbitrating the exchange of the printer operation data between the operating system component and the at least one plug-in application.

10. The method of claim 9, wherein the at least one function includes at least one of a printer start function, a printer stop function, a printer pause function, a printer configuration function and a printer status function.

11. The method of claim 9, wherein the at least one plug-in application includes at least two plug-in applications, and wherein the method further comprises arbitrating the exchange of the printer operation data between the material applicator and each of the at least two plug-in applications.

12. The method of claim 11, wherein arbitrating includes restricting the management of the operation of the at least one function of the material applicator to one of the at least two plug-in applications.

13. The method of claim 9, further comprising limiting an amount of the printer operation data exchanged between the material applicator and the at least one plug-in application based on a frequency of requests for printer operation data by the at least one plug-in application.

14. The method of claim 9, wherein exchanging the printer operation data includes executing at least one remote procedure call (RPC).

15. The method of claim 9, further comprising processing a license key associated with the at least one plug-in application.

16. The method of claim 15, further comprising limiting the exchange of the printer operation data with a respective one of the at least one plug-in application based on the license key.

17. The method of claim 9, further comprising adjusting at least one operational parameter of the material applicator based on a portion of the printer operation data to be received from the at least one plug-in application.

18. The method of claim 9, further comprising providing a set of predefined printer functions configured to extend capabilities of the material applicator to the at least one plug-in application.

* * * * *